United States Patent

Jou et al.

[11] Patent Number: 5,869,849
[45] Date of Patent: Feb. 9, 1999

[54] LIGHT-EMITTING DIODES WITH HIGH ILLUMINATION

[75] Inventors: Ming-Jiunn Jou, Hsinchu; Ming-Yung Jow, Taoyuan Hsien; Chuan-Ming Chang; Chia-Cheng Liu, both of Hsinchu; Jinn-Kung Sheu, Tainan Hsien; Biing-Jye Lee, Hsinchu, all of Taiwan

[73] Assignee: Industry Technology Research Institute, Hsinchu, Taiwan

[21] Appl. No.: 539,686

[22] Filed: Oct. 5, 1995

[51] Int. Cl.$^6$ .................................................. H01L 33/00
[52] U.S. Cl. ................................ 257/96; 257/97; 257/103
[58] Field of Search ............................. 257/94, 96, 97, 257/103; 372/45

[56] References Cited

U.S. PATENT DOCUMENTS

| | | | |
|---|---|---|---|
| 5,008,718 | 4/1991 | Fletcher et al. | 257/94 |
| 5,481,122 | 1/1996 | Jou et al. | 257/96 |
| 5,502,316 | 3/1996 | Kish et al. | 257/94 |

Primary Examiner—Minh-Loan Tran
Attorney, Agent, or Firm—Rabin & Champagne P.C.

[57] ABSTRACT

A surface-emitting AlGaInP LED is disclosed. The LED uses a GaP layer as a window layer to eliminate the current crowding effect, or may has an ITO window layer and use GaP, instead of GaAs, as the substrate to eliminate the current-crowding effect and avoid the emitted light being absorbed by the substrate. The GaP layer is bonded to the double hetero-structure epitaxy layer by a wafer bonding technique. The present invention, however, provides a manufacturing procedure which is easier and more reliable to handle than prior arts.

8 Claims, 5 Drawing Sheets

LIGHT-EMITTING DIODES WITH HIGH ILLUMINATION

BACKGROUND OF THE INVENTION

1. Field of the Invention

The present invention relates to the structure of a light-emitting diode (LED) and method of manufacturing the same.

2. Description of Prior Art

The AlGaInP alloy system, which is a semiconductor with a direct energy bandgap, has been used for making high quality semiconductor lasers with an emitting wavelength of around 670 nanometers. This alloy system may also be useful for making light-emitting diodes (LEDs) for wavelengths ranging from about 560 to 680 nanometers by adjusting the aluminum to gallium ratio in the active region of the device. Increasing the aluminum proportion produces shorter wavelengths. However, the AlGaInP substance has a still lattice constant matched with the GaAs substrate while the ratio of aluminum and gallium is varied. It has also been demonstrated that metal organic vapor phase epitaxy (MOVPE) provides a means for growing optically efficient AlGaInP hetero-structure devices.

A general structure adopted for the AlGaInP double hetero-structure LED is: forming a n-type AlGaInP cladding layer on a n-type GaAs substrate; then growing an undoped AlGaInP active layer thereon; and growing a p-type AlGaInP cladding layer on the AlGaInP active layer. The light-emitting efficiency of the AlGaInP LED described above does not depend only on the recombination rate of the electrons and the holes in the active layer, but also depends on the efficiency of current spreading in the upper cladding layer. This is, for efficient operation of the LED, current injected by the front electrical contact should be spread evenly in the lateral direction so that the current will cross the p-n junction of the double hetero-structure of AlGaInP uniformly to thereby generate light evenly. The p-type AiGaInP layer, which is grown by means of the MOVPE process, is very difficult to dope with acceptors of a concentration higher than 1E18 cm$^{-3}$. Moreover, it is a material characteristic that hole mobility is low in p-type AlGaInP semiconductors (about 10 to 20 cm$^2$×V/sec). Due to these two factors, the electrical resistivity of the p-type AlGaInP layer is comparatively high (i.e., about 0.5 Ω-cm) so that current spreading is severely restricted. As a result, the current tends to concentrate under the front electrical contact. This is often referred to as current crowding.

Some different structures have been developed to solve the above problems in the prior-art LED.

One technique to solve the current crowding problem is disclosed by Fletcher et al in a U.S. Pat. No. 5,008,718 and in the *Journal of Electronic Materials*, Vol. 20, No. 12, 1991, pp. 1125–1130. The proposed LED structure is shown in FIG. 1, wherein the device geometry of a conventional LED is fabricated with a back electrical contact 110, a substrate of n-type GaAs 120, a double hetero-structure of AlGaInP 130, which includes a layer of n-type AlGaInP 131, a layer of undoped AlGaInP 132, and a layer of p-type AlGaInP 133, and a front electrical contact 150, in which a semiconductor window layer 140 is grown upon the p-type AlGaInP layer 133. The window layer 140 should be selected from materials that have low electrical resistance so that the current can spread out quickly, and a bandgap higher than that of the AlGaInP layers so that the window layer is transparent to light-emitted from the active layer of AlGaInP.

In an LED for generating light in the spectrum from red to yellow, an AlGaAs substance is selected to form the window layer 140. The AlGaAs substance has the advantage of having a lattice constant matched with that of the underlying GaAs substrate 120. In an LED for generating light in the spectrum from yellow to green, a GaAsP or GaP substance is used to form the window layer 140. A drawback of using GaAsP or GaP substances that their lattice constants are not matched with those of the AlGaInP layers 130 and the GaAs substrate 120. This lattice mismatch causes a high dislocation density that produces less than satisfactory optical performance. On the other hand, the window layer has to be grown with a thickness of 5 to several ten micrometers to evenly spread the current. However, this increases the time and complexity for manufacturing an LED due to two growth procedures, i.e. a MOVPE procedure for growing the AlGaInP double hetero-structure and a vapor phase epitaxy (VPE) procedure for growing the thick window layer.

FIG. 2 shows a second prior art LED disclosed in U.S. Pat. No. 5,048,035 by Sugawara et al.. The LED of FIG. 2, in addition to the structure of FIG. 1, is fabricated with a Bragg reflector layer 260, a current-blocking layer 270, a current spreading layer 240, and a ohmic contact layer 245. The current spreading layer 240 has very low electrical resistance and the current-blocking layer 270 is arranged at a position where it is in alignment with the front electrical contact 150 and thus is spread out laterally by the current-blocking layer 270. Moreover, the reflector layer 260 can be used to prevent the light-emitted by the active layers from being absorbed by the GaAs substrate.

A drawback of the LED in FIG. 2 is that the fabricating process, in which the MOVPE procedure needs to be performed twice, is very complex. Moreover, the p-type AlGaInP layer 133 is easily oxidized since it contains a large proportion of aluminum.

Furthermore, light-emitted from the active layer is mostly absorbed by the GaAs substrate since the energy bandgap of the GaAs substrate is less than that of the active layer. To address this drawback in the prior-art LEDs, referring to FIG. 3, another technique is disclosed in U.S. Pat. No. 5,376,580, which includes a n-type GaAs substrate 320, a double hetero-structure of AlGaInP 330, which includes a n-type AlGa InP cladding layer 331, an undoped AlGaInP active layer 332, a p-type AlGaInP cladding layer 333, a p-type GaP window layer 340, a first electrical contact 350 and a second electrical contact 310. This structure is made by etching away the GaAs substrate in an LED as shown in FIG. 1, and bonding a GaP substrate having a thickness of about 350 micrometers to the LED layers having a total thickness of about 50 micrometers utilizing a wafer bonding technique so as to form an AlGaInP LED having a transparent substrate. However, it is very difficult to deal with an LED layer only having a total thickness of about 50 micrometers and to protect the LED membrane from breaking.

The other prior art is disclosed in U.S. Pat. No. 5,317,167. Referring to FIG. 4, the LED includes a p-type AlGaAs holding layer 420, a p-type AlGaInP intermediate layer 430, a double hetero-structure of AiGaInP 440, which includes a p-type AlGaInP cladding 441, an undoped AlGaInP active layer 442 and a n-type AlGaInP cladding layer 443, a front electrical contact 450 and a back electrical contact 410. This prior art grows a AlGaAs layer with a thickness of 30 micrometers by employing MOVPE or LPE (Liquid Phase Epitaxy) after the AiGaInP double hetero-structure has grown. The AlGaAs layer is used as a holding layer of the double hetero-structure. Then, the GaAs substrate is etched away by chemical etching. While manufacturing this prior-art LED, it is difficult to form the 30-micrometer thick membrane, and the transmittance of AlGaAs is worse than that of GaP. Therefore, it is not suitable for being used to fabricate a LED emitting short wavelength (e.g., green light).

SUMMARY OF THE INVENTION

Thus, the primary object of the present invention is to provide a structure of a double hetero-structure surface light-emitting diode and a method for manufacturing the same, that can avoid using a substrate which will absorb the light-emitted.

Another object of the present invention is to provide a structure of a double hetero-structure surface light-emitting diode that is capable of reducing the current crowding effect and increasing the brightness.

Still another object the present invention is to provide a method of manufacturing a double hetero-structure AlGaInP surface light-emitting diode using GaP as a transparent substrate or a window layer to obtain higher efficiency, to improve performance and to reduce the manufacturing time.

BRIEF DESCRIPTION OF THE DRAWING

The present invention can be more fully understood by reading the subsequent detailed description of the preferred embodiments thereof with references made to the accompanying drawings, wherein.

In all of the Figures, identical reference numeral represents the same or similar component of the light-emitting diode utilized for the description of the present invention.

DETAILED DESCRIPTION OF THE PREFERRED EMBODIMENTS

Figure 1:
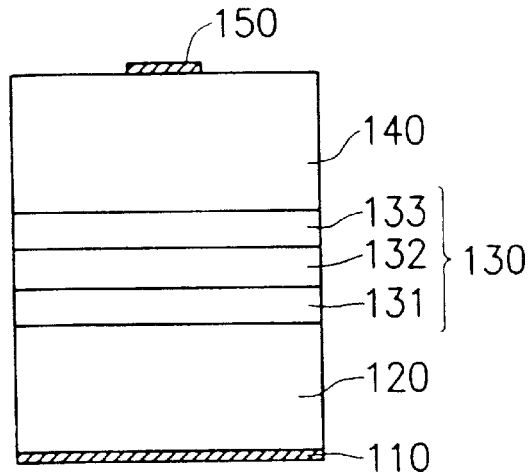
FIG. 1 is a sectional illustration of a first prior art LED.
Figure 2:
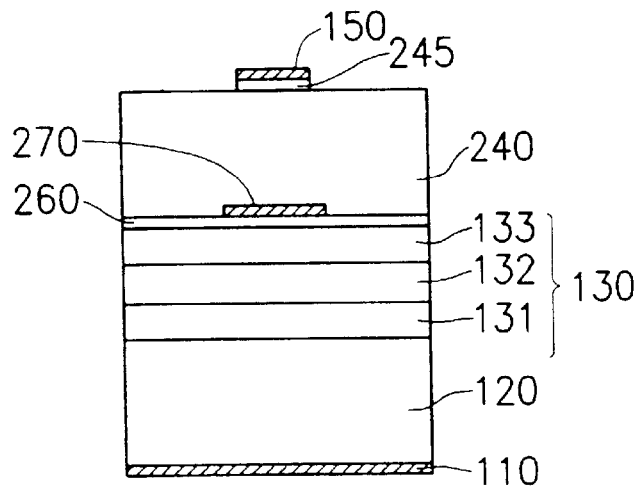
FIG. 2 is a sectional illustration of a second prior art LED.
Figure 3:
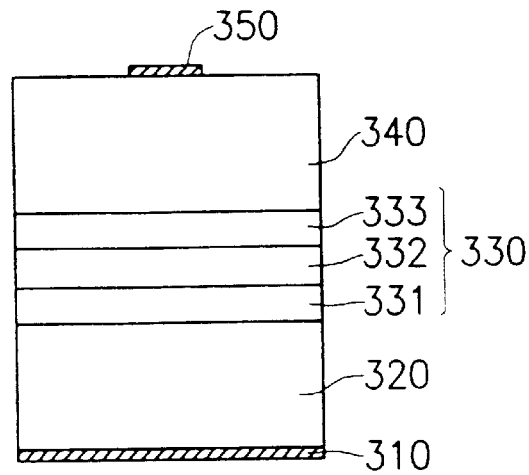
FIG. 3 is a sectional illustration of a third prior art LED.
Figure 4:
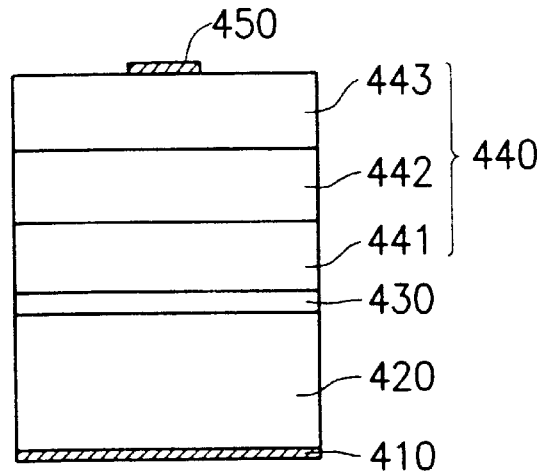
FIG. 4 is a sectional illustration of a fourth prior art LED.

Referring to FIGS. 5a to 5d, the method of manufacturing a light-emitting diode according to one preferred embodiment of the present invention, comprises the steps of: (i) referring to FIG. 5a, sequentially forming an etching removal layer 510 such as AlAs, an ohmic contact layer 520 and a double hetero-structure of AlGaInP 530, which includes a p-type AlGaInP cladding layer 531, an active AlGaInP layer 532 and a n-type AlGaInP cladding layer 533, on a GaAs substrate 500; (ii) referring to FIG. 5b, bonding a n-type GaP layer 540 to the double hetero-structure of AlGaInP 530; (iii) referring to FIG. 5c, removing the etching removal layer 510 by selective etching so as to lift the GaAs substrate 500 off; (iv) referring to FIG. 5d, respectively forming a first electrical contact 550a on the n-type GaP layer 540 and a second electrical contact 560a on the ohmic contact layer 520. In which an area of the first electrical contact 550a has to be smaller than that of the second electrical contact 560a, because the n-type GaP layer 540 serves as a transparent window layer of the LED and the light generated by the double hetero-structure of AlGaInP 530 is emitted via the window layer, i.e. the n-type GaP layer 540. Therefore, the first electrical contact 550a must be defined in a small region to avoid blocking the light emitted.

Figure 5A:
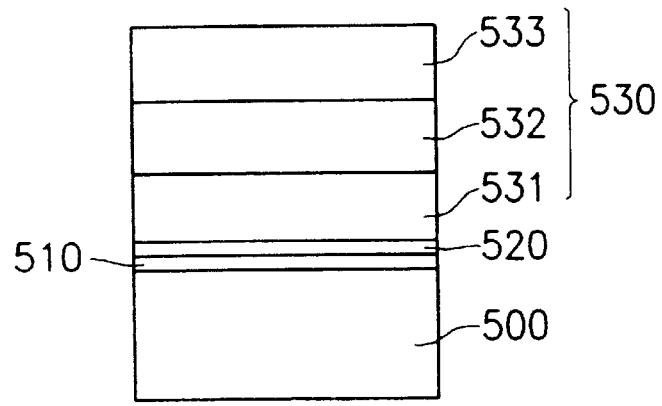
FIGS. 5a to 5d are sectional illustrations of manufacturing an LED in accordance with a preferred embodiment of the present invention.
Figure 5B:
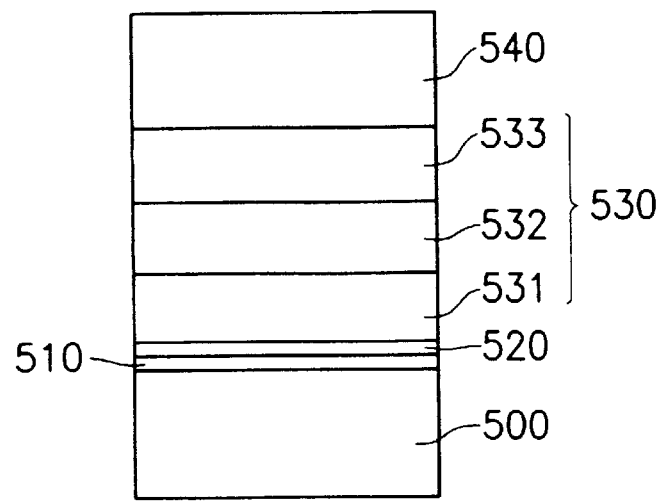
Figure 5C:
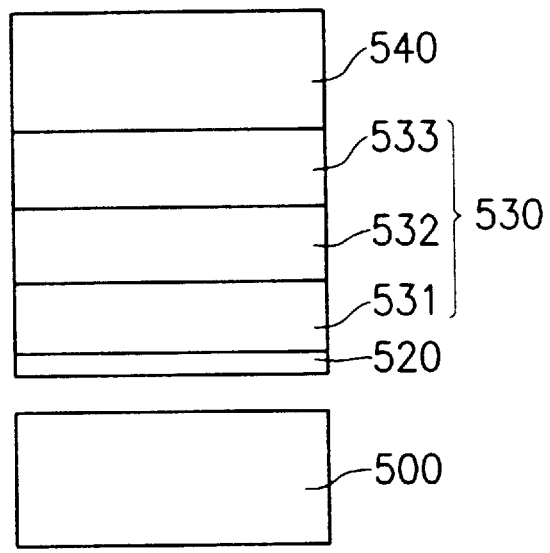
Figure 5D:
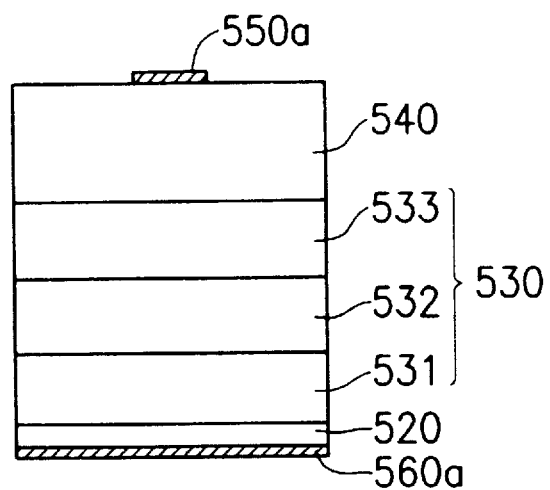
Figure 6A:
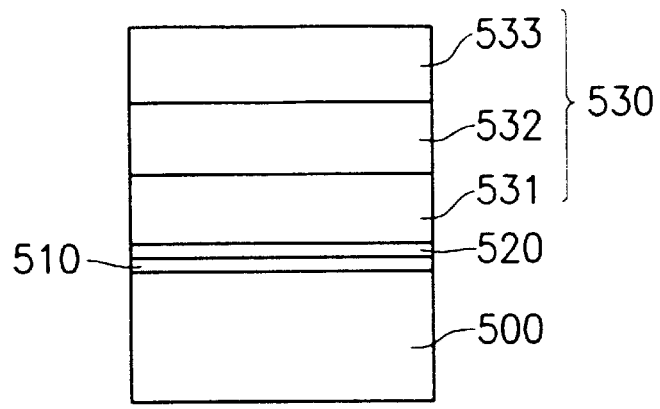
FIGS. 6a to 6e are sectional illustrations of manufacturing an LED in accordance with another preferred embodiment of the present invention.
Figure 6B:
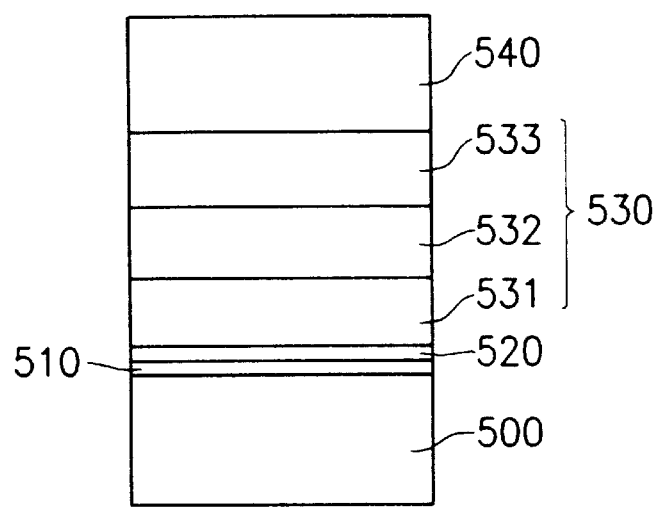
Figure 6C:
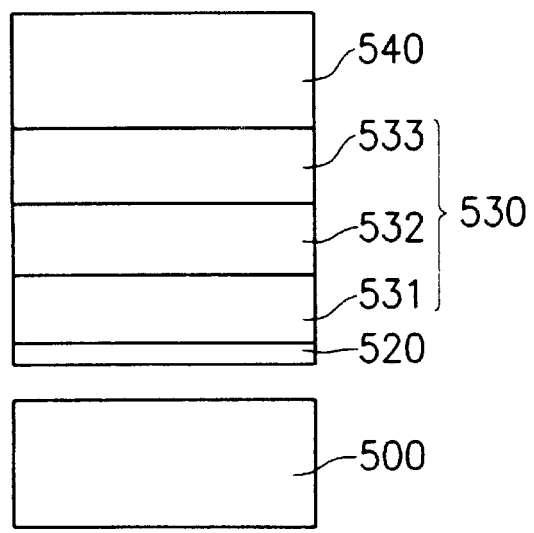
Figure 6D:
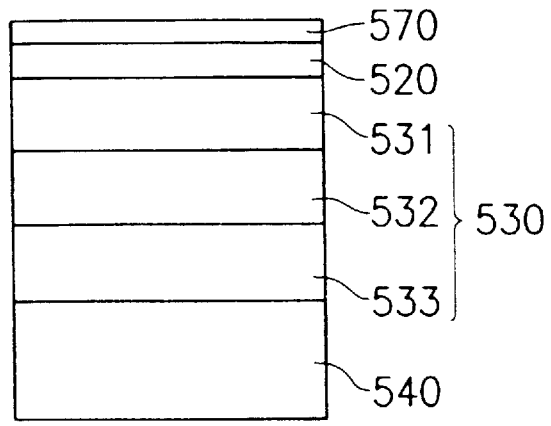
Figure 6E:
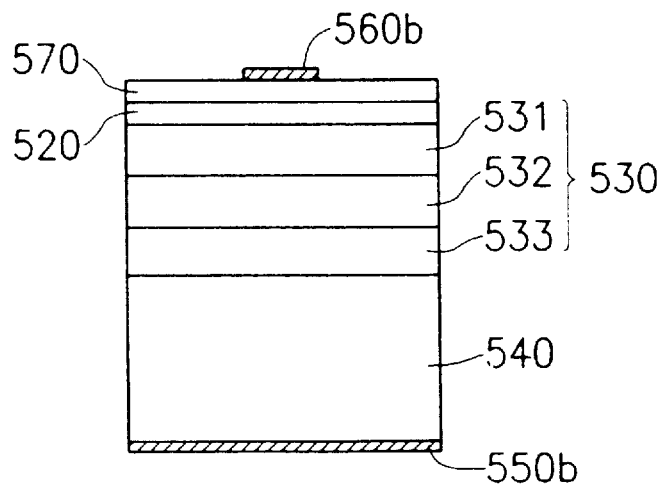

FIG. 5d is a sectional view illustrating the structure of an exemplary LED constructed in accordance with the present invention. The LED of FIG. 5d includes a second electrical contact 560a, a substrate of n-type GaP 540, a double hetero-structure of AlGaInP 530 (generally referred to as active p-n junction layers), a transparent ohmic contact layer 520, and a first electrical contact 550 a. The double hetero-structure of AlGaInP 530 includes, as in the LEDs of FIGS. 1–4, a layer of p-type AlGaInP 531, a layer of undoped AlGaInP 532, and a layer of n-type AlGaInP 533.

Referring to FIGS. 6a to 6e, the method of manufacturing a light-emitting diode according to another preferred embodiment of the present invention comprises the steps of: (i) referring to FIG. 6a, sequentially forming an etching removal layer 510, an ohmic contact layer 520 and a double hetero-structure of AlGaInP 530, which includes a p-type AlGaInP cladding layer 531, an active AlGaInP layer 532 and a n-type AlGaInP cladding layer 533, on a GaAs substrate 500; (ii) referring to FIG. 6b, bonding a n-type GaP layer 540 to the double hetero-structure of AlGaInP 530; (iii) referring to FIG. 6c, removing the etching removal layer 510 by selective etching so as to lift the GaAs substrate 500 off; (iv) referring to FIG. 6d, forming an indium tin oxide (ITO) current spreading layer 570 on the ohmic contact layer 520; (v) referring to FIG. 6e, respectively forming a first electrical contact 550b on the n-type GaP layer 540 and a second electrical contact 560b on the ITO current spreading layer 570. An area of the first electrical contact 550b has to be larger than that of the second electrical contact 560b, because the n-type GaP layer 540 serves as a transparent substrate of the LED and the light generated by the double hetero-structure of AlGaInP 530 is emitted via the p-type ohmic contact layer 520 and the ITO current spreading layer 570. Therefore, the second electrical contact 560b must be defined in a small region to avoid blocking the light emitted.

In the above two preferred embodiments, MOVPE is used to grow the double hetero-structure of AlGaInP. In addition, before bonding the n-type GaP layer to the LED epitaxy layers, it is necessary to clean the grime and remove the oxide formed on the LED epitaxy layer. Then the n-type GaP layer is bonded with the LED epitaxy layer, and put into an oven filled with nitrogen. The n-type GaP layer is fixedly bonded with the LED epitaxy layer by heating to 650° C. for 30 minutes in the oven.

The method of lifting the GaAs substrate off requires an etching solution of HF: $H_2O=1:10$ which has high selectivity for different materials such as GaAs, AlAs and AlGaInP. In the above two embodiments, the etching removal layer (i.e. AlAs layer) can be completely removed by dipping in the etching solution for 10 hours whereby the GaAs substrate will lift off automatically.

GaAs, AlGaAs, InGaP or InGaAsP is used to form the ohmic contact layer 520. Its carrier concentration must be greater than $10^{18}$ cm$^{-3}$ and its thickness must be greater than 500 Å at least, so as to form good ohmic contact between the double hetero-structure of AlGaInP 530 and the first electrical contact 550a.

Moreover, a buffer layer can be formed between the n-type AlGaInP cladding layer and the n-type GaP layer to lower the energy barrier between the n-type AlGaTnP cladding layer and the n-type GaP layer so as to facilitate the wafer bonding.

The LEDs in the above two embodiments both display high brightness. In the first embodiment, the n-type G-aP serving as the window layer has good electrical conductivity. Generally, for a commercialized n-type GaP, its carrier concentration can be about $1\times10^{18}/cm^3$, its electron mobility is about 120 $cm^2\times V/sec$, and its corresponding electrical resistivity is only about 0.05 Ω-cm. Therefore, it can prevent the LED from current crowding by employing GaP as a window layer of the LED. The GaP window layer displays good transmittance for the range of red light to green light. In addition, since the thickness of the GaP window layer is about 350 micrometers, the light-emitting efficiency of the LED is improved. The relevant discussion is disclosed in "Twofold efficiency improvement in high performance AlGaInP light-emitting diodes in the 555 –620 nanometers spectral region using a thick GaP window layer", *Appl. Phys. Lett.* Vol. 61, No. 9, 31 Aug., 1992, pp.1045~1047, written by K. H. Huang et al., wherein it is found that the light-emitting efficiency of a LED having a window layer with a thickness of 50 micrometers is about three times of that of a LED having no window layer, and is about two times of that of a LED having a window layer with a thickness of 10 micrometers.

As to the second preferred embodiment, the benefits of the ITO window layer, such as low electrical resistivity and a short manufacturing time, are maintained in the n-type GaAs substrate-based LED. Furthermore, the luminance of a LED having ITO window layer is about two times of that of a LED having no window layer. The luminance of a LED would be twofold or threefold, when, instead of a gaAs substrate, a n-type GaP substrate is used, which is transparent for the light in a wide range of wavelength.

The present invention has been described hitherto with exemplary preferred embodiments. However, it is to be understood that the scope of the present invention need not be limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A light-emitting diode comprising:
    a transparent ohmic contact layer of a first conductivity type, which has a second electrical contact formed thereon;
    a double hetero-structure of AlGaInP on the transparent ohmic contact layer;
    a GaP layer of a second conductivity type on the double hetero-structure;
    a first electrical contact on the GaP layer for conducting current through the double hetero-structure of AlGaInP with the second electrical contact; and
    a conductive transparent oxide formed between the second electrical contact and the transparent ohmic contact layer of a first conductivity type.

2. The light-emitting diode as claimed in claim 1, wherein the GaP layer of a second conductivity type serves as a transparent substrate.

3. The light-emitting diode as claimed in claim 2, wherein the area of the second electrical contact is smaller than that of the first electrical contact.

4. The light-emitting diode as claimed in claim 3, wherein the ohmic contact layer of the first conductivity type is one of GaAs, AlGaAs, InGaP and InGaAsP.

5. The light-emitting diode as claimed in claim 3, further comprising a buffer layer of a second conductivity type formed between the AlGaInP cladding layer of a second conductivity and the GaP layer of a second conductivity type so as to lower the energy barrier therebetween and facilitate bonding the GaP layer of a second conductivity type to the LED layers.

6. The light-emitting diode as claimed in claim 1, wherein the conductive transparent oxide comprises indium tin oxide.

7. The light-emitting diode as claimed in claim 6, wherein the ohmic contact layer of the first conductivity type is one of GaAs, AlGaAs, InGaP and InGaAsP.

8. The light-emitting diode as claimed in claim 6, further comprising a buffer layer of a second conductivity type formed between the AlGaInP cladding layer of a second conductivity and the GaP layer of a second conductivity type so as to lower the energy barrier therebetween and facilitate bonding the GaP layer of a second conductivity type to the LED layers.

* * * * *